United States Patent
Garth (10) Patent No.: US 7,476,963 B2
(45) Date of Patent: Jan. 13, 2009

(54) THREE-DIMENSIONAL STACK MANUFACTURE FOR INTEGRATED CIRCUIT DEVICES AND METHOD OF MANUFACTURE

(76) Inventor: Emory Garth, 1111 W. 12th St., Apt. #108, Austin, TX (US) 78703

( * ) Notice: Subject to any disclaimer, the term of this patent is extended or adjusted under 35 U.S.C. 154(b) by 71 days.

(21) Appl. No.: 11/582,241

(22) Filed: Oct. 17, 2006

(65) Prior Publication Data
US 2007/0035003 A1  Feb. 15, 2007

Related U.S. Application Data

(62) Division of application No. 10/949,770, filed on Sep. 24, 2004, now abandoned.

(51) Int. Cl.
*H01L 23/02* (2006.01)
(52) U.S. Cl. ............ 257/686; 257/686; 257/774; 257/777; 438/108; 438/109; 438/110; 438/113; 438/455; 438/458; 438/459; 438/462; 438/629; 438/667; 438/612
(58) Field of Classification Search ........... 257/686, 257/777, 774; 438/109, 108, 110, 113, 455, 438/458, 459, 462, 629, 667, 612
See application file for complete search history.

(56) References Cited

U.S. PATENT DOCUMENTS

| 4,794,092 A | * | 12/1988 | Solomon | 438/109 |
| 4,868,712 A | * | 9/1989 | Woodman | 361/689 |
| 5,057,023 A | | 10/1991 | Kabadi et al. | |
| 5,117,282 A | | 5/1992 | Salatino | |
| 5,426,566 A | * | 6/1995 | Beilstein et al. | 361/735 |
| 5,454,160 A | | 10/1995 | Nickel | |
| 5,625,221 A | | 4/1997 | Kim et al. | |
| 6,205,654 B1 | | 3/2001 | Burns | |
| 6,222,265 B1 | | 4/2001 | Akram et al. | |
| 6,433,413 B1 | * | 8/2002 | Farrar | 257/678 |
| 6,560,109 B2 | * | 5/2003 | Yamaguchi et al. | 361/704 |
| 6,621,155 B1 | | 9/2003 | Perino et al. | |
| 6,670,701 B2 | | 12/2003 | Matsuura et al. | |
| 6,686,222 B2 | * | 2/2004 | Omizo et al. | 438/107 |
| 6,692,305 B2 | * | 2/2004 | Nelson et al. | 439/608 |
| 6,714,418 B2 | | 3/2004 | Frankowsky et al. | |
| 6,716,670 B1 | | 4/2004 | Chiang | |
| 2003/0075811 A1 | | 4/2003 | Cohn et al. | |
| 2008/0003712 A1 | * | 1/2008 | Moden et al. | 438/106 |

* cited by examiner

*Primary Examiner*—David Vu
*Assistant Examiner*—Tram H Nguyen
(74) *Attorney, Agent, or Firm*—Antony P. Ng; Dillon & Yudell LLP (57) ABSTRACT

An integrated circuit package assembly formed by stacking flip-chip mounted substrates interleaved with precisely dimensioned spacers and then bonded by injection molding the stack. The sides of the stack are sawed off to expose vias in the substrates, and multilevel-interconnect substrates are precisely aligned on the sides of the stack. Solder pads on the interconnect substrates are reflowed to form a solder connection to the exposed vias, allowing complex interconnection between diverse points along the edge connectors of each substrate. In one embodiment, solder balls are reflowed on ball-grid-array pads at the top of the stack to provide external electrical connections.

7 Claims, 10 Drawing Sheets

THREE-DIMENSIONAL STACK MANUFACTURE FOR INTEGRATED CIRCUIT DEVICES AND METHOD OF MANUFACTURE

CROSS-REFERENCE TO A RELATED APPLICATION

The present application is a divisional of U.S. patent application Ser. No. 10/949,770, filed on Sep. 24, 2004 now abandoned. Applicants claim benefit of priority under 35 U.S.C. § 120 to the above-mentioned patent application.

BACKGROUND OF THE INVENTION

1. Field of the Invention

The present invention relates in general to integrated circuit packages and assemblies, and in particular is directed to stacking of a plurality of integrated circuit devices within a three-dimensional integrated circuit package manufacture.

2. Description of the Related Art

Integrated circuits are typically packaged in a single chip or 'monolithic' configuration which, in turn, is soldered or plugged into a printed circuit board, or other type of interconnect support substrate. In a multi-chip 'hybrid' package, several devices are assembled into a single package, having the advantages of reduced weight, size and, occasionally, circuit performance. In an effort to further enhance packaging density, edge-wise or vertically stacked multi-chip packaging assemblies have been proposed. In such configurations, rather than array a plurality of devices in what is essentially a two dimensional or planar layout, the devices are arranged on top of one another in a 'stack' or 'layered' manufacture and interconnected along the edges thereof utilizing wire bonds or flexible metallic wires connected to a common substrate.

SUMMARY OF THE INVENTION

In accordance with the present invention, improved methods and articles of manufacture of a three-dimensional integrated circuit assembly are disclosed. One preferred embodiment of the present invention is an integrated circuit package assembly formed by stacking flip-chip mounted substrates interleaved with precisely dimensioned spacers and then bonded by injection molding the stack. The sides of the stack are sawed off to expose vias in the substrates, and multilevel-interconnect substrates are precisely aligned on the sides of the stack. Solder pads on the interconnect substrates are reflowed to form a solder connection to the exposed vias, allowing complex interconnection between diverse points along the edge connectors of each substrate. In one embodiment, solder balls at the top of the stack are reflowed on ball-grid-array pads to provide external electrical connections.

All objects, features, and advantages of the present invention will become apparent in the following detailed written description.

BRIEF DESCRIPTION OF THE DRAWINGS

This invention is described in a preferred embodiment in the following description with reference to the drawings, in which like numbers represent the same or similar elements and one or a plurality of such elements, as follows.

DETAILED DESCRIPTION OF PREFERRED EMBODIMENTS

Figure 1:
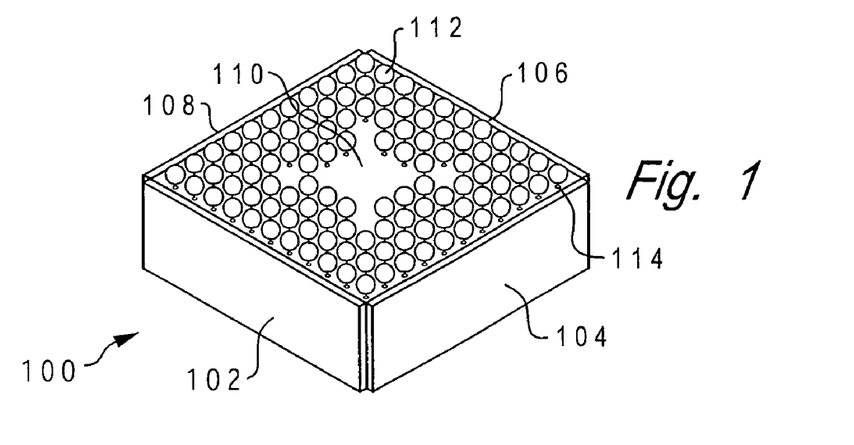
FIG. 1 shows an assembled three-dimensional (3-D) integrated circuit package, in accordance with a preferred embodiment of the present invention.

With reference now to the Figures and in particular with reference to FIG. 1, there is shown an assembled three-dimensional (3-D) integrated circuit package, in accordance with a preferred embodiment of the present invention. 3-D integrated circuit manufacture 100 is shown having z-axis interconnect substrates 102-108 forming the sides of integrated circuit manufacture 100. A top thin multilayer printed circuit board 110 forms the top layer of integrated circuit manufacture 100. A plurality of ball grid array (BGA) solder balls 112 are strategically placed and electrically connected to interconnect vias 114 surfacing on the top surface of printed circuit board 110.

Figure 2A:
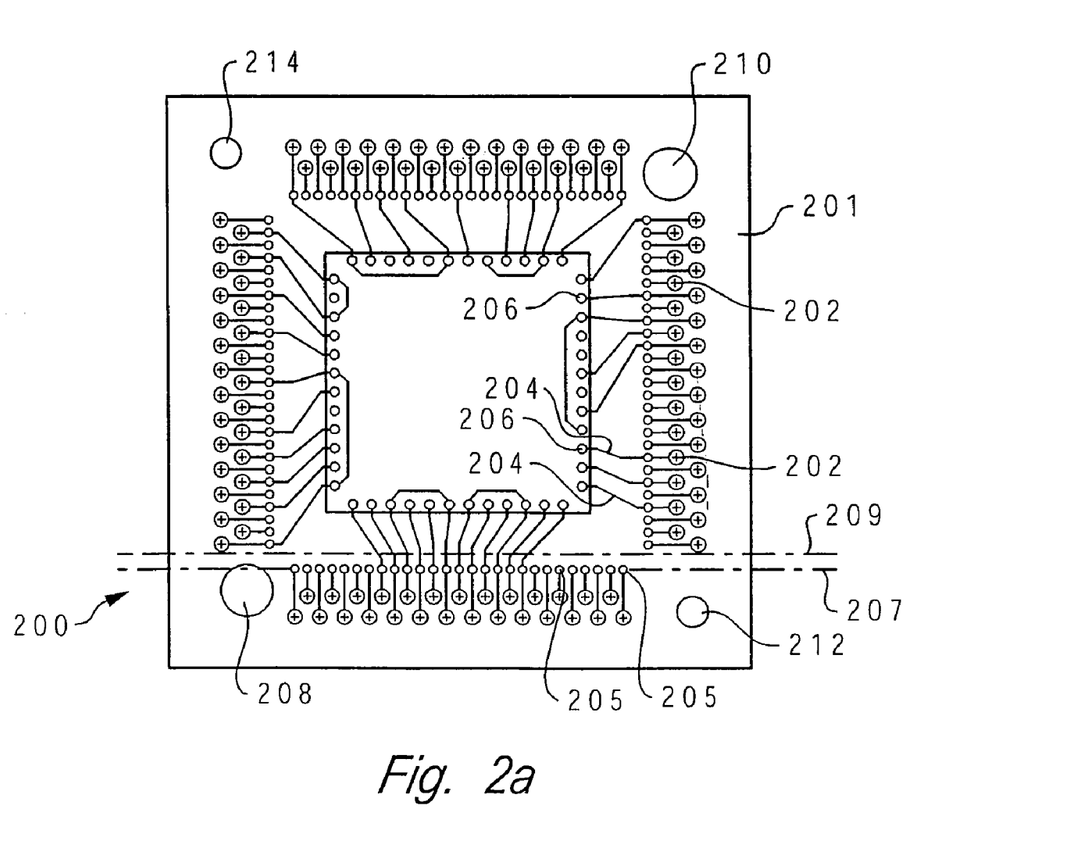
FIG. 2a shows a thin multilayer printed circuit board used as the x-y axis interconnect substrate, in accordance with the preferred embodiment of the present invention.
Figure 2B:
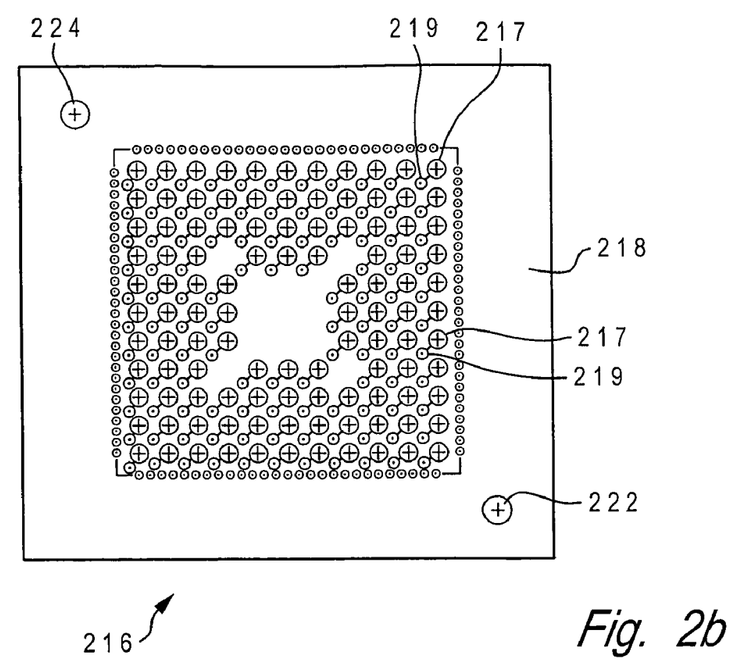
FIG. 2b shows a ball grid array substrate, in accordance with the preferred embodiment of the present invention.
Figure 2C:
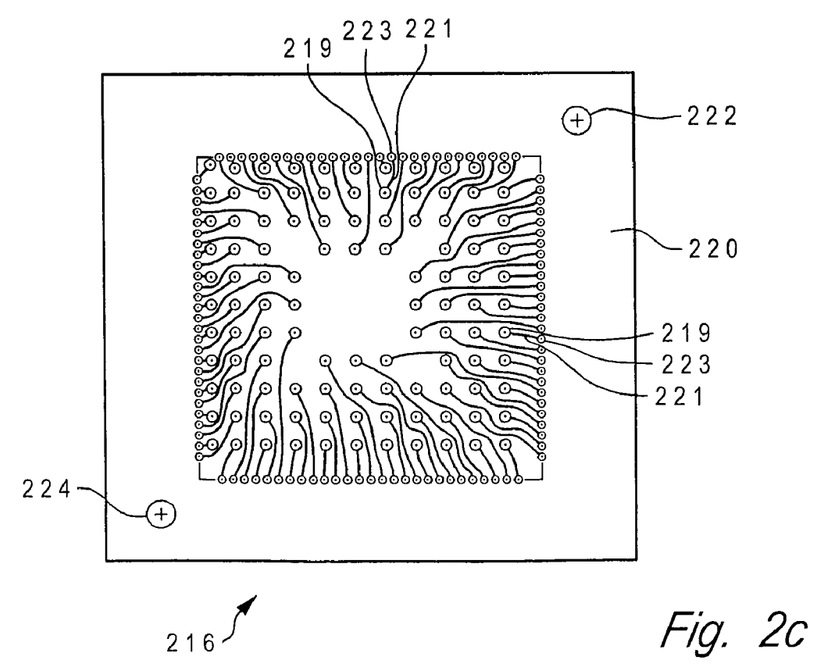
FIG. 2c shows the bottom face of the BGA substrate of FIG. 2b.

FIG. 2a shows a thin multilayer printed circuit board used as the x-y axis interconnect substrate, in accordance with the preferred embodiment of the present invention. Printed circuit board (PCB) technology is well known in the electronics industry, and it is well known how to manufacture an advanced, thin, multilayer PCB with small dimensions and tight mechanical tolerances related to plated-through-hole size, layer-to-layer registration and tooling hole positioning accuracy. However, while the preferred embodiment is described as using PCB, it will be appreciated that a substrate as used herein can be any interconnect material or structure that can provide electrical connection between ICs. PCB 200 shown in FIG. 2a and PCB 216 shown in FIGS. 2b and 2c are each such a multilayer PCB. As will be appreciated, PCBs 200, 216 (and interconnect 702 shown in FIG. 7) may be a double-layer or a multi-layer printed circuit board having multiple layers of trace interconnects (204) to a plurality of vias (205) and pads (202) on the surface or within lower layers of the printed circuit board.

PCB 200 includes a plurality of pads 202 electrically connected to a plurality of metal traces 204 ending at pads 206 (not all elements are explicitly referenced, but all similar elements are intended to be referred). PCB 200 is adapted for mounting integrated circuit semiconductor devices, preferably "flip-chips," as is well known in the art, having solder bumps or pins distributed over the face of the chip, usually around the periphery. This array of solder bumps is soldered to pads 206 on PCB 200. When a flip-chip integrated circuit is properly aligned and mounted on PCB 200, pads 202, 206 and traces 204 create digital and analog signal, power and ground connections to the integrated circuit chip. PCB 200 further has encapsulant flow holes 208, 210 and alignment holes 212, 214. These holes 208-214 are formed using highly accurate tooling, which place alignment holes 212, 214 to within a relative positional accuracy of pads 205 of no greater than ±1 mils.

With reference now to FIG. 2b, there is shown a ball grid array substrate, in accordance with the preferred embodiment of the present invention. BGA substrate 216 is a printed circuit board having a plurality of conductive solder pads 217 on surface 218. Each solder pad 217 is connected by a trace to a via 219 that leads to another layer in the double-layer or multi-layer PCB substrate 216.

FIG. 2c shows the bottom face 220 of BGA substrate 216. Each of the conductive vias 219 pass from the top surface 218 to the bottom surface 220, and follow trace 221 to an outer via 223. BGA substrate 216 also has alignment holes 222, 224.

Figure 3:
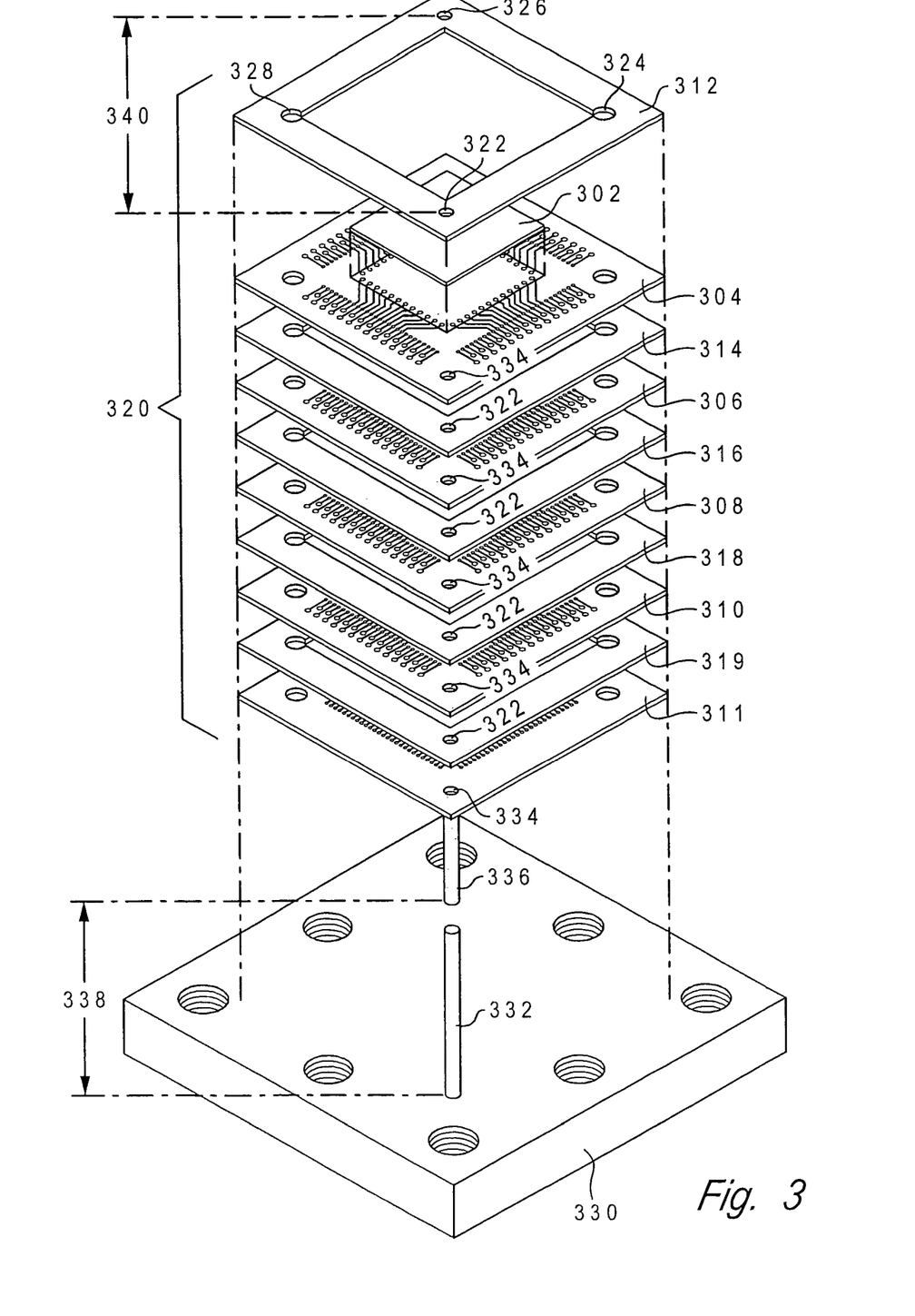
FIG. 3 shows an exploded perspective view of the integrated circuit package assembly at the beginning of the process for assembling the 3-D integrated circuit package, in accordance with the preferred embodiment of the present invention.

With reference now to FIG. 3, there is shown an exploded perspective view of the integrated circuit manufacture at the beginning of the process for assembling the 3-D integrated circuit package, in accordance with the preferred embodiment of the present invention. As seen in FIG. 3, integrated circuit 302 is flip-chip mounted to a x-y interconnect substrates 304. Flip-chip integrated circuits (not shown) are similarly mounted on x-y interconnect substrates 306-310. X-y interconnect substrates 304-310 are formed in the manner as described for producing PCB 200. Each of the x-y interconnect substrates are then electrically tested to confirm that the integrated circuits 302 are known good die at this first-level of manufacture. This is facilitated in the preferred embodiment by pads 202 interconnected to pads 206. At this point in the manufacture, a testing device contacting pads 206 can electrically test the integrated circuit 302.

During the manufacture of 3-D integrated circuit package 100, each of the x-y interconnect substrates and spacers 304-319 are stacked on top of each other, with the spacers interleaved in between each of the x-y interconnect substrates to form a stacked interconnect substrates 320. The stacked interconnect substrates 320 is stacked on alignment block 330. Interleaved between each of the x-y interconnect substrates 304-310 are spacers 312-319, formed of a non-thermal conducting but electrically non-conducting materials such as fiberglass reinforced epoxy. At the bottom of stacked interconnect, mounted on pins 332, 336, is BGA substrate 311, which is created in the same manner as BGA substrate 216. In an alternative embodiment, BGA substrate 311 and spacer 319 is not used and x-y interconnect substrate is a multilayered PCB, with a bottom surface 218, a middle layer configured as surface 220 and a top surface 201.

X-y interconnect substrates 304-310, BGA interconnect substrate 311, and spacers 312-319 have been formed to an extremely precise thickness to insure a desired substrate-to-substrate dimensioning for the subsequent z-axis interconnect substrate attachment to be described below. For example, interconnect substrates and spacers 304-319 have a thickness of 12 mils to within a tolerance of +/−1 mil. Each of the spacers 312-319 contain precisely aligned alignment holes 322, 326 that are precisely formed to match the alignment holes 334 (corresponding to alignment holes 212, 214) on the corresponding x-y interconnect substrates 304-310.

The stacked interconnect substrates 320 is aligned utilizing the alignment block 330, which includes alignment pins 332 and 336. Alignment pins 332 and 336 are precisely machined pins having precise dimensions and being precisely mounted on alignment plate 330 so that the distance between the alignment pins 332 and 336 is precisely equal to the distance between the alignment holes in stacked interconnect substrates 320. For example, alignment pins 332, 336 are of a diameter precisely matched to the diameter of alignment holes 322, 334, 326 (and alignment holes 212, 214, as seen in FIG. 2a), and the distance there between being precisely matched with the distance between alignment holes 322 and 326 (and 212 and 214). More particularly, the distance 338 between the center axes of pins 332, 336 is set equal to the distance 340 between the center axes of alignment holes 322 and 326. During the stacking step of the manufacture process, each of the alignment holes 322, 334 are aligned with pins 332 and, similarly, each of the alignment holes 326 and corresponding holes (not shown) in layers 304, 304, 308, 310, 314, 316 and 318 are aligned with pin 336. Stacked interconnect substrates 320 is then mounted onto pins 332, 336 by inserting the pins into each of the corresponding alignment holes.

Figure 4:
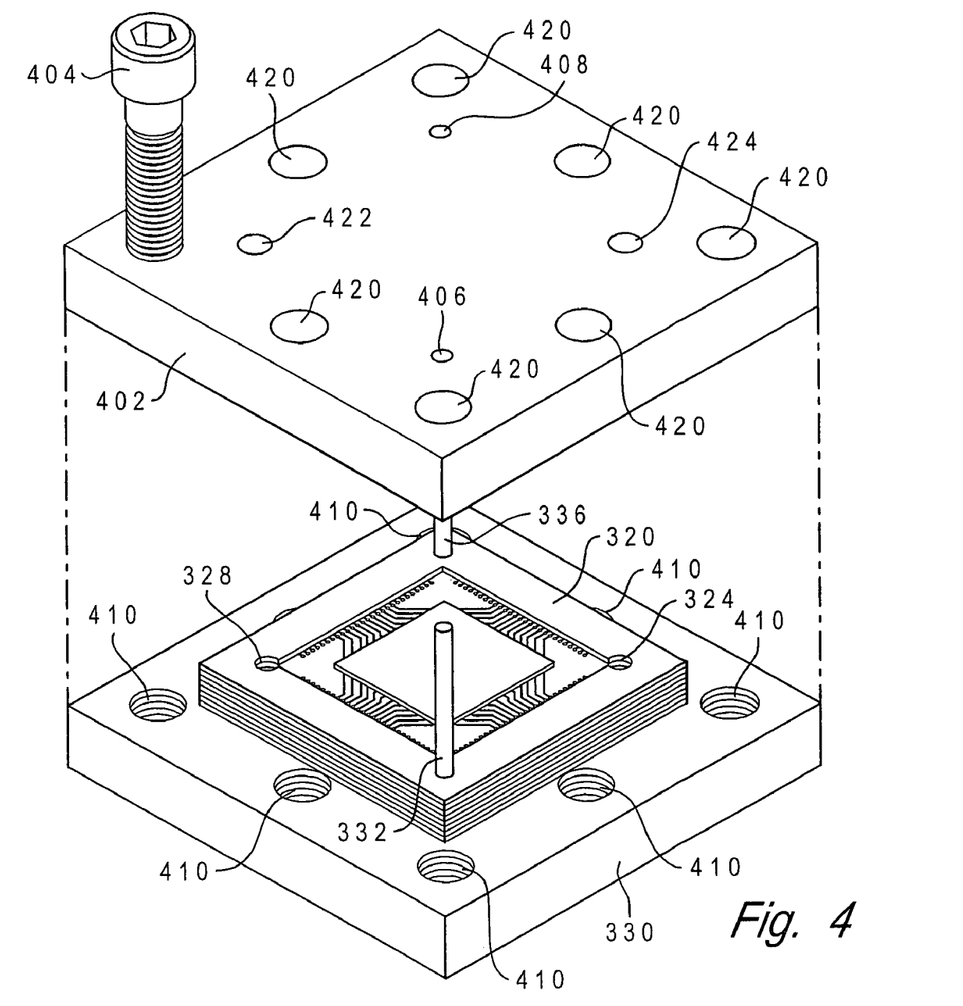
FIG. 4 shows an exploded view of the stacked interconnect substrates held between molding plates, in accordance with the preferred embodiment of the present invention.

FIG. 4 shows an exploded view of stacked interconnect substrates 320 held between molding plate 330 and a top molding plate 402. Molding plate 402 is precisely aligned by tooling pins 332, 336, which are guided through alignment holes 406 and 408 on molding plate 402, to be placed on top of the stacked interconnect substrates 320. With stacked interconnect substrates 320 securely held there between, molding plates 330 and 402 are secured together by machine screw 404, threaded through a hole (not shown) in molding plate 402 and into threaded hole 410 on molding plate 330. Similar machine screws may also be screwed into threaded holes 420 distributed across molding plate 402 and threaded holes 410 complimentarily distributed across molding plate 330.

With molding plates 330, 402 securely held together, the stacked interconnect substrates 320 are then encapsulated. Thermal cure epoxy encapsulates are injected into either or both of injection holes 422, 424 on molding plate 402 using industry standard molding techniques as are well known in the electronics packaging industry. Injection hole 422 is precisely aligned with injection holes 212 and 222 and 324 such that liquefied encapsulant flows freely there between. Similarly, injection hole 424 is precisely aligned with injection holes 214 and 224 and 328 such that liquefied encapsulant flows freely there between. As the encapsulant is injected into the molding manufacture, encapsulant will flow freely in between the layers of substrates and spacers until the entire stacked interconnect substrates 320 are immersed in encapsulant. The encapsulate is then thermally cured by subjecting the encapsulate to high temperatures appropriate to cure the encapsulate and completely surround the stacked interconnect substrates 320. Once the stacked interconnect substrates 320 is encapsulated, it is removed from molding plate 330, 402.

The next step in the manufacture process uses a wafer saw to precisely cut the stacked interconnect substrates 320 through a center axis (for example, center axis 207) of vias 205 (see FIG. 2a) along each edge of substrate 200. Because the stacked interconnect substrates 320 have been precisely aligned using molding plates 330, 402 and then encapsulated, a precise cut of a wafer saw cuts exactly through the pads 205 of each integrated circuit substrate 304, 306, 308, 310, 311. Vias 205 are holes that have been created in the substrate of x-y interconnect substrate 200 (for example, by drilling) and are plated (i.e., metalized) through from the top to the bottom of the vias 205. Alternatively, the stacked interconnect substrates 320 could be sawed along line 209 as seen in FIG. 2a to expose the traces 204 at the edge of each x-y interconnect substrate 200 in stacked interconnect substrates 320.

Figure 5:
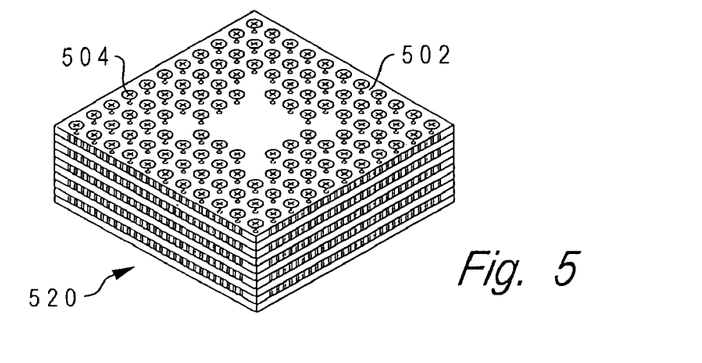
FIG. 5 shows a perspective view of the stacked integrated circuit module after encapsulation and sawing, in accordance with the preferred embodiment of the present invention.

With reference flow to FIG. 5, there is shown a perspective view of stacked integrated circuit module 520, which comprises stacked interconnect substrates 320 following the step described above of sawing the edges of the substrates. This perspective is viewed from what was the bottom of stacked interconnect substrates 320 such that the surface 502 is BGA interconnect substrate 311 and shows surface 218 thereof. The plurality of contact pads 504 correspond to pads 217. As will be appreciated, the present invention is not limited to a set number of stacked x-y substrates that comprises stacked integrated circuit module 520. For example, one application of the preferred embodiment utilizes a package of nine layers, each layer used to process a bit of memory so that the package can process an entire byte of memory with parity in parallel.

Figure 6:
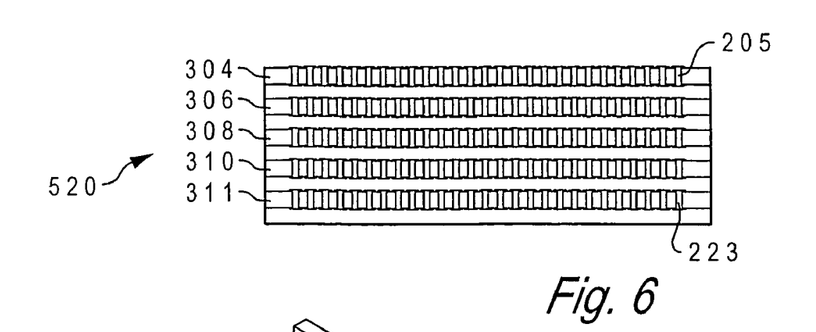
FIG. 6 shows a magnified side view of the stacked integrated circuit module, in accordance with the preferred embodiment of the present invention.

With reference now to FIG. 6, there is shown a magnified side view of stacked integrated circuit module 520. As shown, the exposed vias 205 for each of the stacked interconnect substrates 304, 306, 308, 310, 311 are exposed on the side edges of each substrate.

Figure 7:
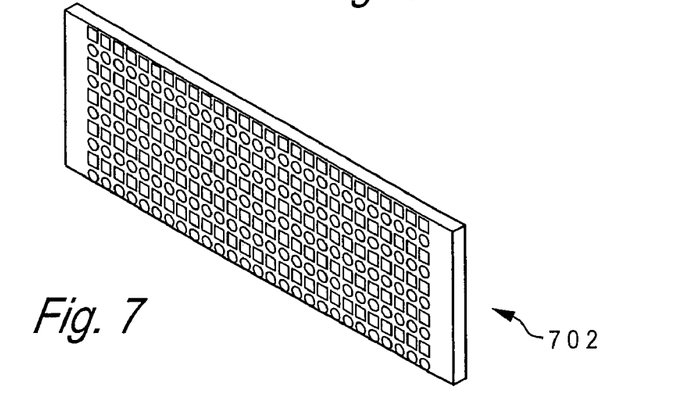
FIG. 7 shows a perspective view of a z-axis interconnect substrate, in accordance with the preferred embodiment of the present invention.

With reference now to FIG. 7, there shown is a perspective view of a z-axis interconnect, in accordance with the preferred embodiment of the present invention. Z-axis interconnect 702 is a double-layer or multi-layer printed circuit board similar to x-y interconnect substrate 200. In a preferred embodiment, z-axis interconnect substrate 702 is a multi-layered PCB having multi-level interconnects in three dimensions, thereby allowing interconnects to cross or connect nodes of the matrix interconnect and permitting complex connection combinations between the connection pins of the integrated circuit packages in the stack.

Figure 8A:
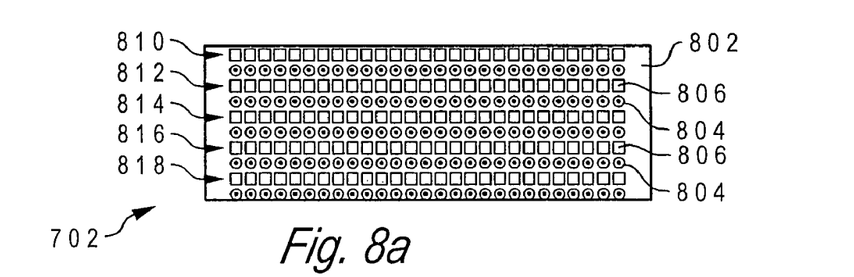
FIG. 8a shows a front view of z-axis interconnect substrate, in accordance with the preferred embodiment of the present invention.
Figure 8B:
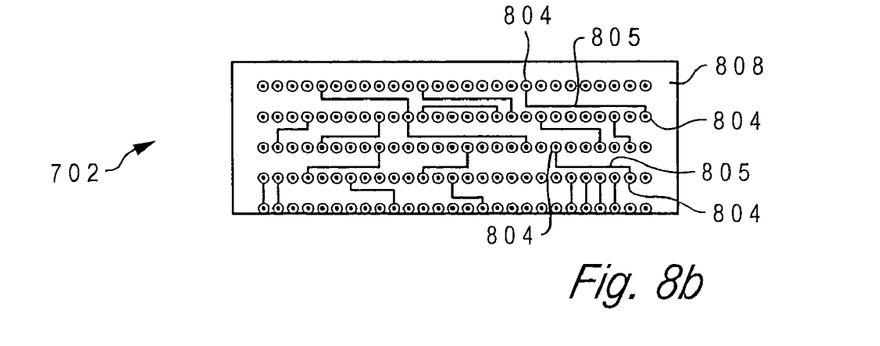
FIG. 8b shows a back view of z-axis interconnect substrate, in accordance with the preferred embodiment of the present invention.

FIG. 8a shows a front view of z-axis interconnect substrate 702. The inside face 802 of z-axis interconnect substrate 702 has a plurality of rows of vias 804 electrically connected to a plurality of rows 810-818 of solder pads 806. Solder pads 806 are precisely aligned and positioned upon face 802 to directly match up and make electrical contact with each of vias 205 exposed on the side edge of stacked integrated circuit modules 520. These solder pads 806 may be precisely formed on face 802 using any number of solder mask techniques or other alignment techniques well known in the industry. FIG. 8b shows a back view of z-axis interconnect substrate 702. Face 808 receives the conductive vias 804 from face 802, and provides traces 805 to electrically connect a particular via 804 to another one or more vias 804 within the z-axis interconnect substrate 702, as is appropriate to implement an electrical circuit in 3-D integrated circuit package 100. In an alternative embodiment, z-axis interconnect substrate 702 is a multi-layered PCB with solder ball interconnects on its outside surface, with an outer surface having bond or BGA pads 217 similar to surface 218 with BGAs mounted thereon, a middle layer configured as surface 808 and a top surface 802.

Figure 9:
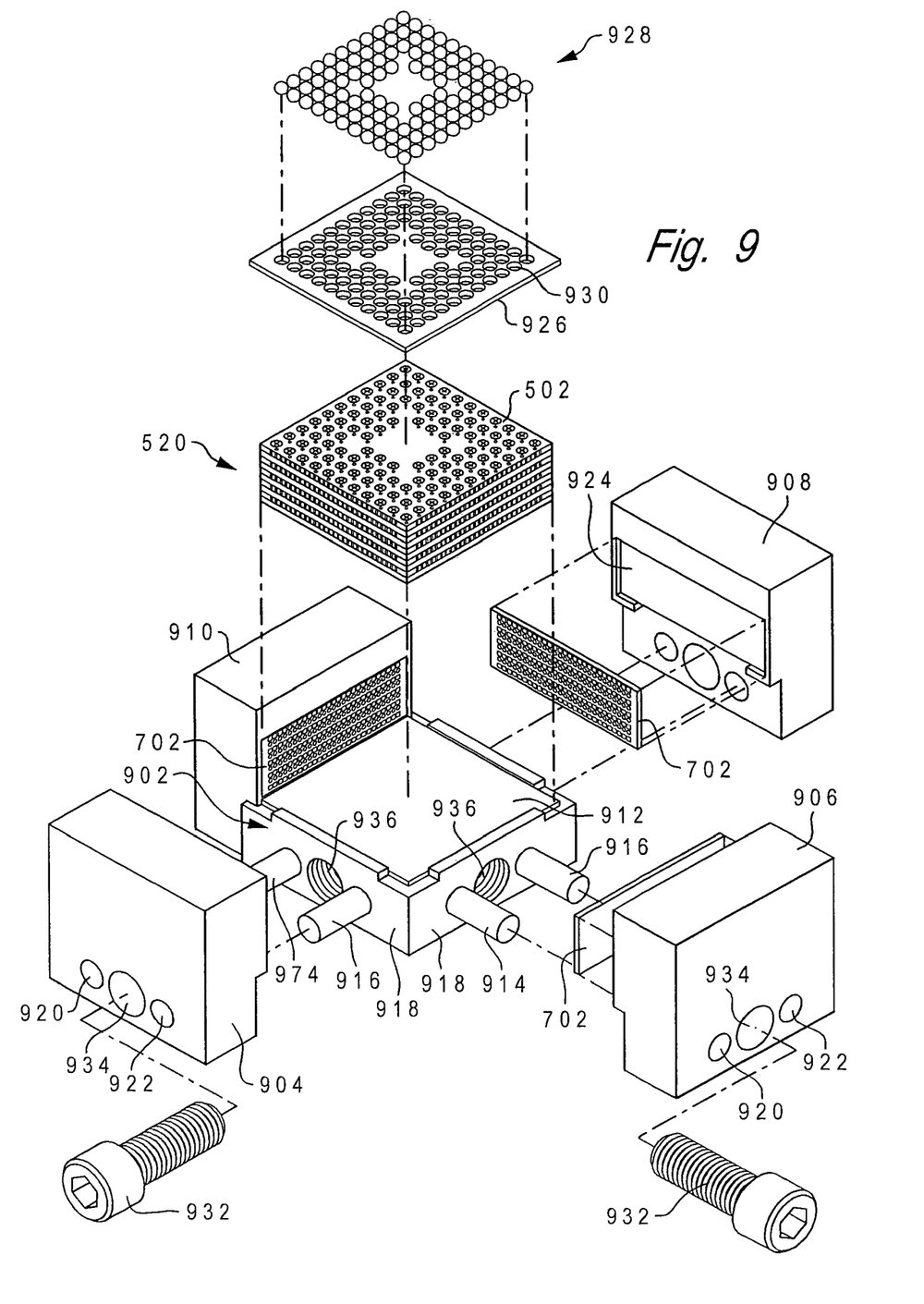
FIG. 9 shows an exploded perspective view of the 3-D integrated circuit package held in a z-axis interconnect substrate alignment fixture during the final step of the manufacturing process, in accordance with the preferred embodiment of the present invention.

With reference now to FIG. 9, there is shown an exploded perspective view of the 3-D integrated circuit package held in a z-axis alignment fixture during the final step of the manufacturing process in accordance with the preferred embodiment of the present invention. The z-axis alignment fixture 1002 (see FIG. 10) comprises a base 902 and four side fixtures 904-910 enclosing the 3-D integrated circuit package 100. Base 902 is precisely machined metal or another sturdy material having a face plate 912 for receiving and precisely positioning stacked integrated circuit module 520. Base 902 has two guide pins 914, 916 on each side face 918 of base 902. Each of the side alignment plates 904-910 contain precisely machined holes 920, 922 for receiving pins 914, 916, respectively. Each side alignment plate 904-910 contains an inset 924 precisely machined to mate with z-axis interconnect substrate 702.

With stacked integrated circuit module 520 mounted in place on surface 912 and with each of the z-axis interconnect substrates 702 mounted within insets 924, each of the side alignment plates 904-910 are brought together at base 902 to mate machined holes 920, 922 on receiving pins 914, 916, respectively. BGA alignment solder plate 926 is then placed on surface 502 of (z-axis stacked) integrated circuit module 520 and solder balls 928 are positioned in each of the holes 930 on solder ball alignment plate 926. Each of the side alignment plates 904-910 are held in place by machine screws, for example, machine screws 932 are threaded through holes 934 in side alignment plates 904, 906 and screwed into threaded holes 936. Machine screws are similarly mounted into side alignment plates 908 and 910.

Figure 10:
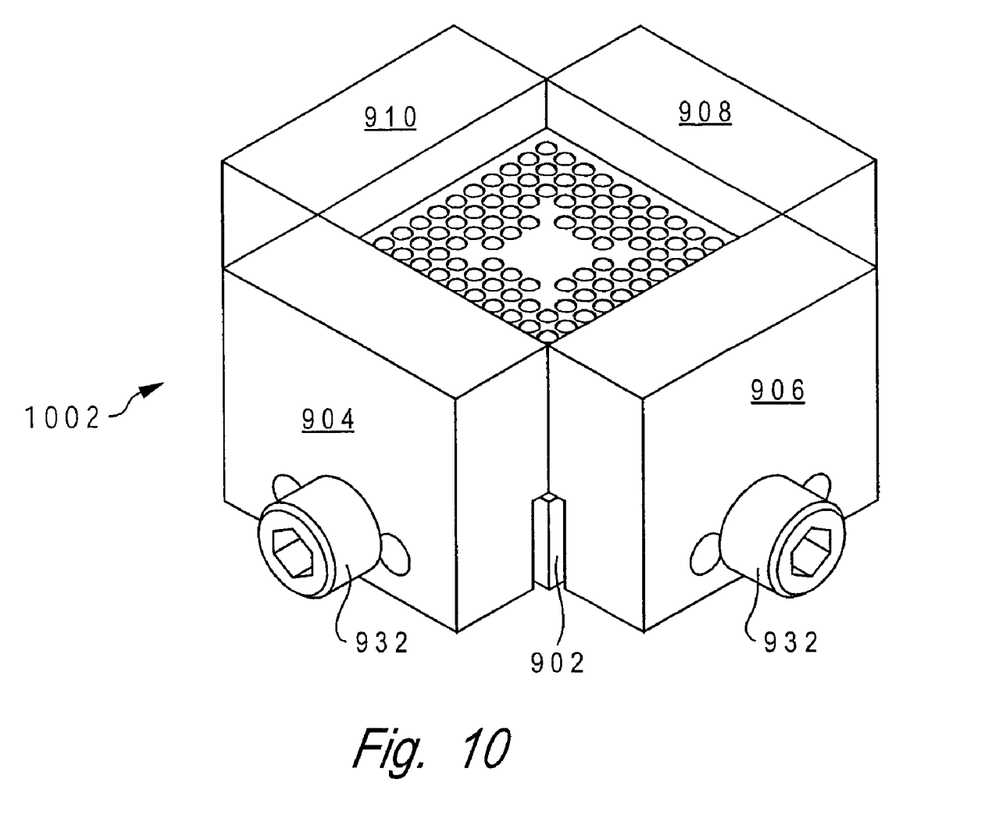
FIG. 10 shows a perspective view of the z-axis interconnect substrate alignment fixture assembled and prepared for the final step of manufacture of the 3-D integrated circuit package, in accordance with the preferred embodiment of the present invention.

With reference now to FIG. 10, there is shown a perspective view of the z-axis alignment fixture assembled and prepared for the final step of manufacture of the 3-D integrated circuit package, in accordance with the preferred embodiment of the present invention. The assembled z-axis alignment fixture 1002 is placed in a furnace or oven set at a temperature to allow reflow of the solder balls 928 and the solder pads 806 on z-axis interconnect substrate 702. For example, a temperature of approximately 220° C. is sufficient for most applications. As solder balls 928 reflow through the BGA solder alignment plate 926, they make contact with each of the solder pad contacts 504 on surface 502 of stacked integrated circuit module 520 to form a BGA contact. Within side alignment plates 904-910, the solder pads 806 are held in contact with the exposed vias 205 to form an electrical connection as the solder pads 806 reflow in the furnace. After an appropriate period of time to best affect the reflow of the solder, the z-axis alignment fixture 1002 is removed from the oven and disassembled, resulting in the 3-D integrated circuit package as shown in FIG. 1.

With reference now back to FIGS. 6 and 8a, it will be appreciated that each of the solder pads 806 contained within row 810 on face 802 of z-axis interconnect 702 is now soldered to each of the vias 205 on the corresponding face of x-y interconnect substrate 304. Similarly, solder pads 806 in each of rows 812, 814, 816 and 818 on face 802 of each z-axis interconnect 702 is soldered and electrically connected to a corresponding via 205 in each of substrates 306, 308, 310 and 311. Accordingly, each of the vias 804 and traces 805 of face 808 of each z-axis interconnect substrate 702 provides a signal, power or ground path between all of the circuits contained within the 3-D integrated circuit package 100. Moreover, the electrical connections created by vias 804 and traces 805 to the solder pads 806 in row 818 provide an electrical connection to the vias 205 on BGA interconnect substrate 311 providing an electrical signal path back through traces 221, through vias 219 to solder pads 217, and ultimately out onto BGA 110 to provide the external signal, power and ground connections to the 3-D integrated circuit package 100. In an alternative embodiment where z-axis interconnect substrate 702 is a multi-layered PCB BGAs on its outer surface, electrical connection to 3-D integrated circuit package 100 via such BGA connections on the outer surfaces of z-axis interconnect substrates 102-108 may provide further external signal, power and ground connections to the 3-D integrated circuit package 100. While a solder reflow process is incorporated into the preferred embodiment, alternative embodiments do not include a reflow and instead use pressure contacts to provide the interconnection of electrical signal pathways between substrates.

Figure 11:
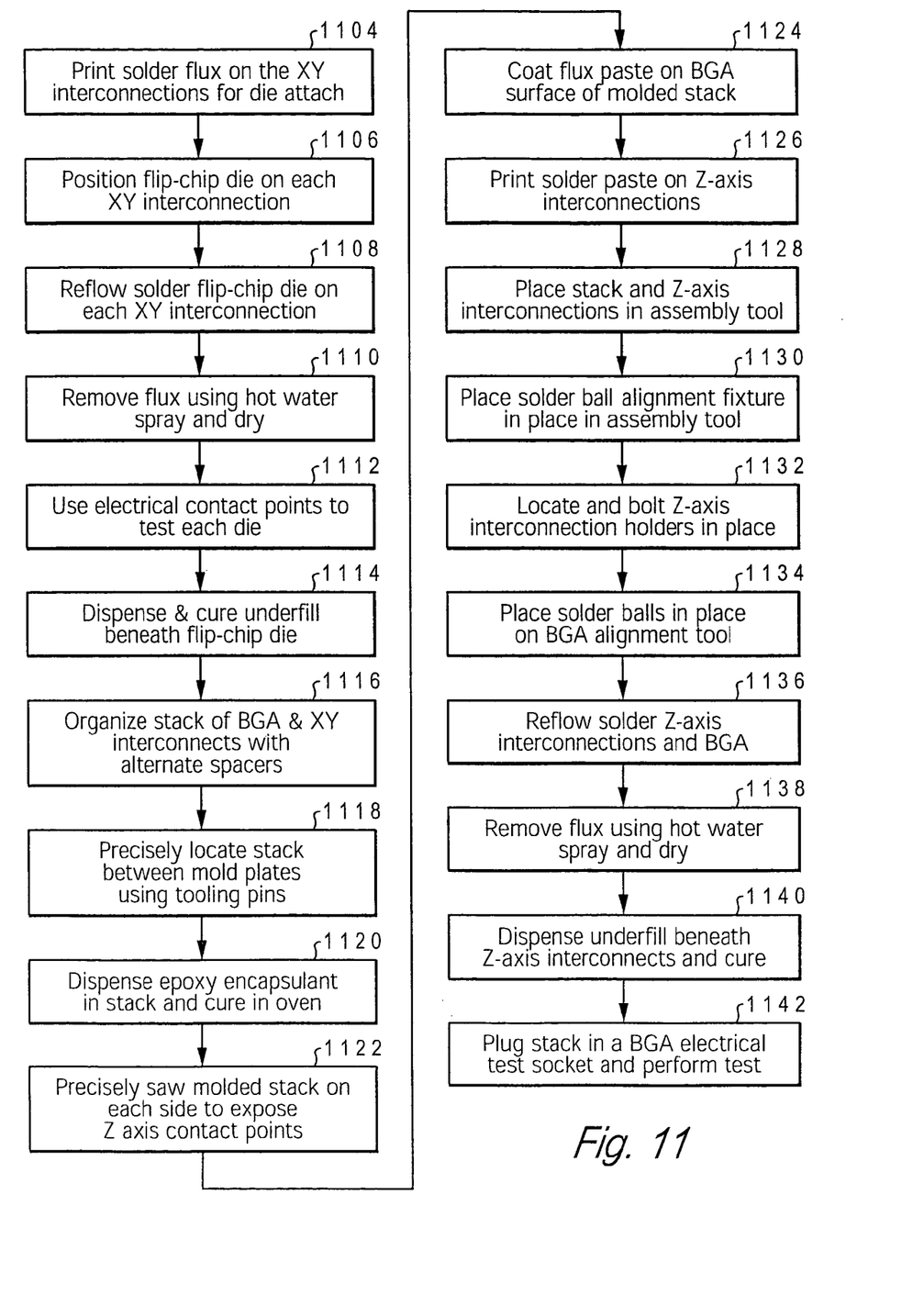
FIG. 11 shows a flow diagram of the manufacturing process of a 3-D integrated circuit package, in accordance with the preferred embodiment of the present invention.

With reference now to FIG. 11, there is shown a flow diagram of the manufacturing process of a 3-D integrated circuit package, in accordance with the preferred embodiment of the present invention. Process 1100 begins at step 1104, where a solder flux is printed on the x-y interconnect substrates 304, 306, 308, and 310 to prepare the substrates for die attachment. At step 1106, a flip-chip die 302 is positioned on each of the x-y interconnect substrates to align the flip-chip 302 with the corresponding pads or vias 206 to allow proper pin connection from the chip 302 to the corresponding x-y interconnect substrate 304-310. At step 1108, the solder on each of the pads 206 are reflowed using a heating process on each of the x-y interconnection substrates 304-310 to create solder bonding of the chips 302 to each of the corresponding interconnects. At step 1111, the flux residue from the reflow solder step 1108 is removed from each of the x-y interconnect substrates 304-310 using a hot water spray and dry process. At step 1112, each of the x-y interconnect-chip combinations 302-310 are tested using electrical testing at pads 202 to confirm proper operation of the chip 302 and proper electrical connection to each of the vias 205. The process then proceeds to step 1114, where an under-fill is dispensed and cured beneath the flip-chip die 302 on each of the x-y interconnect substrates 304-310. This under-fill ensures a solid, thermal and mechanical connection of the chip 302 to each of the x-y interconnect substrates.

The manufacturing process then proceeds to step 1116, where the stack of BGA interconnect substrate 311, x-y interconnect substrates 304-310 and spacers 314-319 are precisely aligned and organized into stacked interconnect substrates 320. At step 1118, stacked interconnect substrates 320 is precisely located on alignment pins 332, 336 between molding plates 330 and 402, which are then secured together by screws 404. At step 1120, an epoxy encapsulate is dispensed throughout the stack 320 by injecting the epoxy encapsulate into holes 406, 408 in molding plate 402 and down through injection holes 324, 328 in each of the spacers 312-319 and injection holes 208, 210 in each of the x-y interconnect substrates 304-310. Encapsulant may be injected into only one hole 406, 408 to permit the other hole 406,408 to act as an exit for the out-flow of encapsulant when the molding has filled. Further at step 1120, the entire mold is then placed in an oven and cured at approximately 150° C. The process then proceeds to step 1122, where the stack 320 is sawed along each edge, for example along axis 207, to expose each via 205 along all four edges of each of the x-y interconnect substrates 304-310 and BGA interconnect 311, and thereby forming module 520. At step 1124, a coat of flux paste is placed on the BGA surface 502 of the module 520.

Thereafter, at step 1126, a solder paste is printed on four z-axis interconnect substrates 702. At step 1128, the module 520 and each of the z-axis interconnect substrates 702 are placed on the manufacturing tool comprising base 902, and sides 904-910. The process then proceeds to step 1130, where solder ball alignment plate 930 is placed on top of BGA surface 502. At step 1132, each of the side alignment plates 904-910 are located on pins 914, 916 and bolted into place by bolts 932. At step 1134, solder balls 928 are placed on solder ball alignment plate 926. At step 1136, the solder pads 806 of z-axis interconnect substrates 702 and BGA solder balls 928 are reflowed using a heating process on the manufacturing tool. Thereafter, at step 1138, the flux residue produced by step 1136 is removed using hot water spray and drying process. At step 1140, an under-fill is dispensed beneath each of the x-axis interconnect substrates 702 and is cured. Thereafter, the completed 3-D integrated circuit package 100 is tested by plugging it into a BGA electrical test socket and performing standard diagnostic testing of the integrated circuit system. One advantage to the 3-D integrated circuit package 100 is that the z-axis interconnect substrate can allow for controlled impedance transmission line interconnects for very high speed signals. Further, when comparing bond wires to printed traces, printed traces as used in the preferred embodiment present a much lower inductance load on the signal, a distinct advantage in high speed systems.

Figure 12:
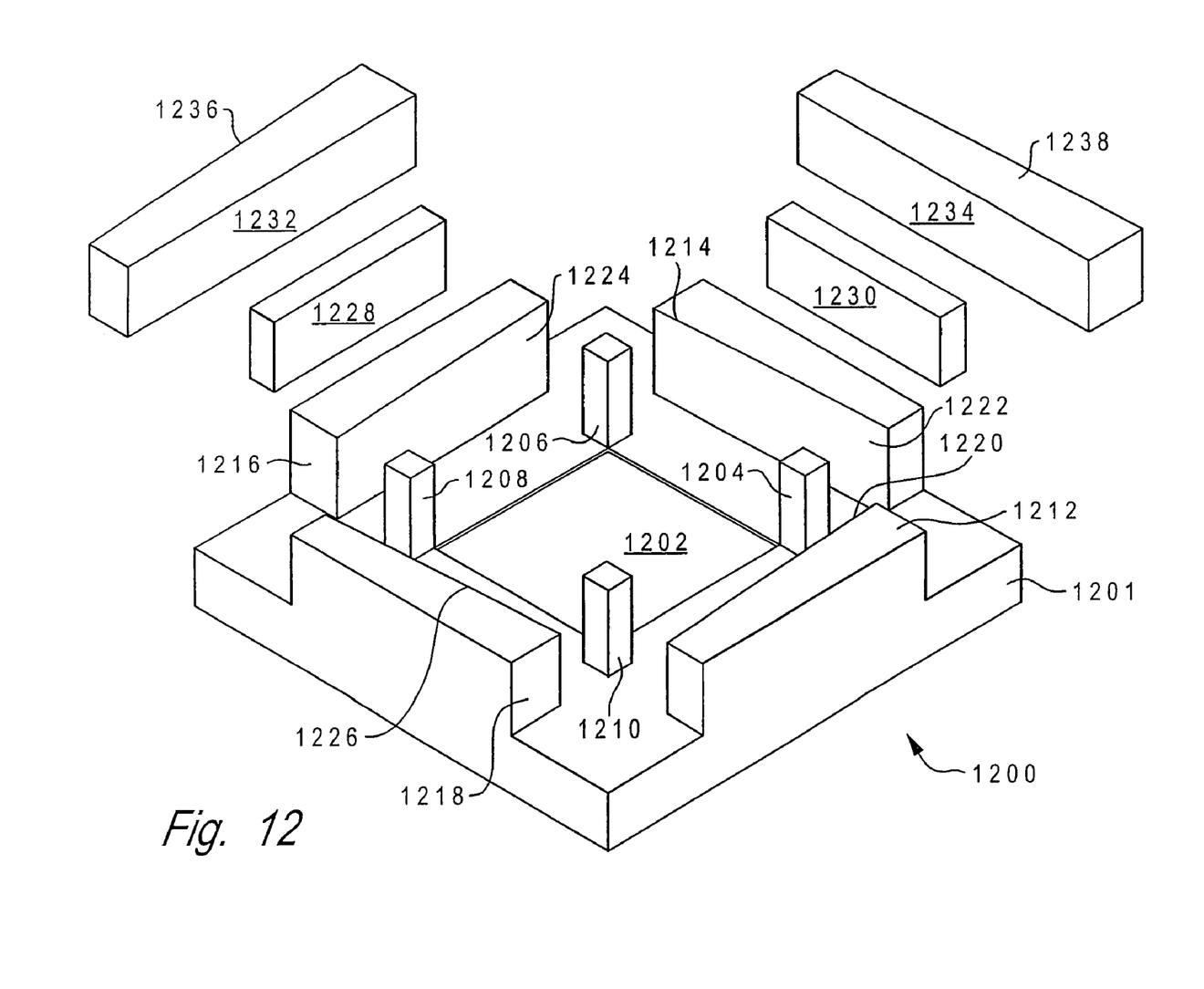
FIG. 12 shows an exploded view of an alternative embodiment of a z-axis assembly reflow solder tool, in accordance with a preferred embodiment of the present invention.

With reference now to FIG. 12, there is shown an exploded view of an alternative embodiment of a z-axis assembly reflow solder tool 1200, in accordance with a preferred embodiment of the present invention. A base 1201 includes an inset region 1202 sized to accommodate the stacked integrated cir 520, rectangular rods 1204-1210, and side columns 1212-1218. Each side column 1212-1218 has an angled side 1220-1226. The z-axis assembly reflow solder tool 1200 further includes spacer bars 1228, 1230 and z-axis substrate holding wedges 1232, 1234. Z-axis substrate holding wedges 1232, 1234 have angled edges 1236, 1238 formed with angles to complement the angles on sides 1222, 1224.

Figure 13:
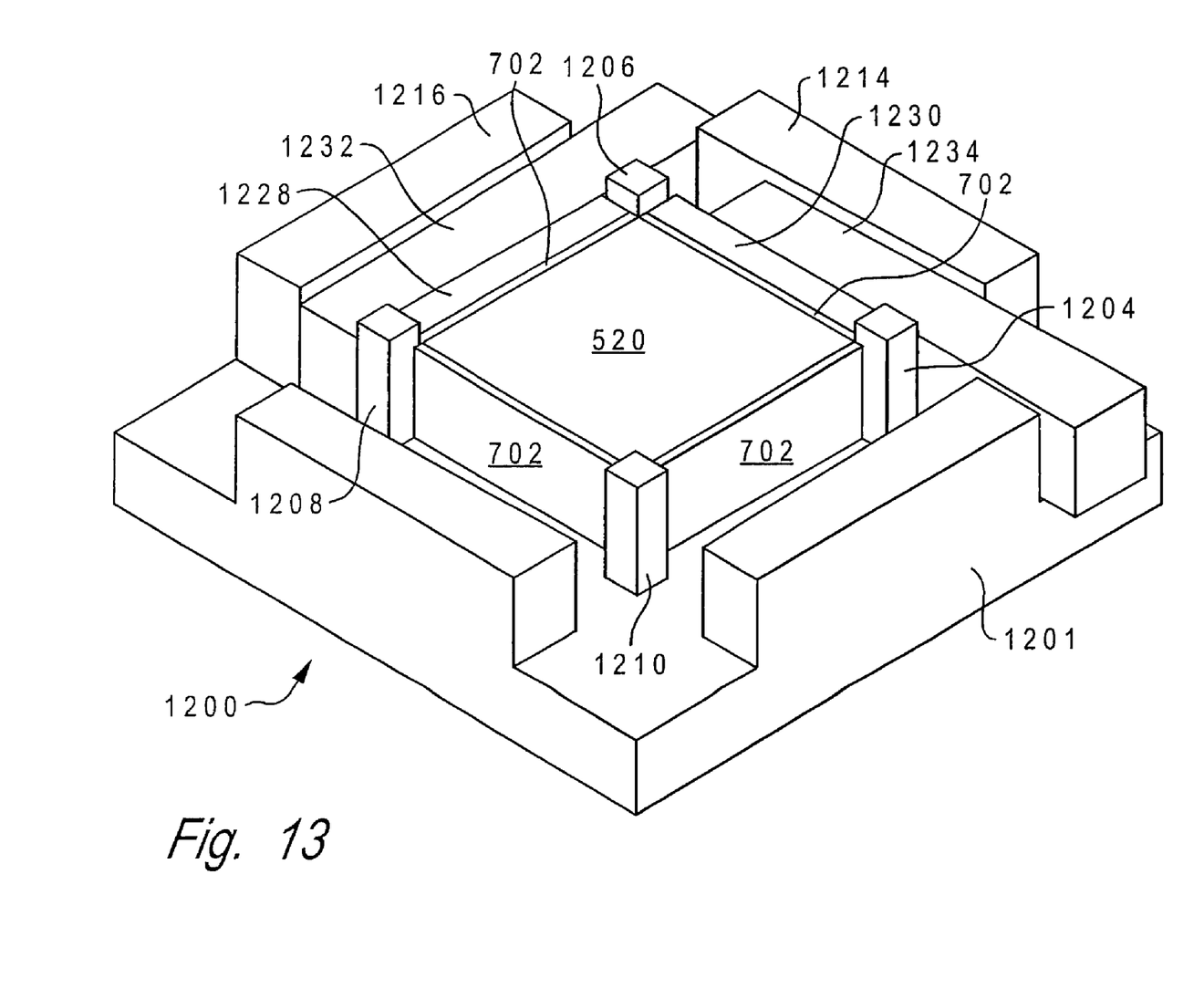
FIG. 13 shows the alternative z-axis assembly reflow solder tool containing a stacked integrated circuit module, in accordance with a preferred embodiment of the present invention.

With reference now to FIG. 13, there is shown the z-axis assembly reflow solder tool 1200 with the stacked integrated circuit module 520 placed in inset 1202 within base 1201, in accordance with a preferred embodiment of the present invention. In this view of the z-axis assembly reflow solder tool, only two sides are shown with the sides corresponding to spacer bars 1228, 1230 being aligned and reflowed. It should be understood that, while not shown in the view of FIG. 13, the bonding of z-axis substrates 702 on the sides opposite columns 1212 and 1218 are bonded simultaneously with the bonding of the sides opposite columns 1214 and 1216 in the same manner as described herein.

After placing module 520 within inset 1202, the z-axis substrates 702 are placed flush against the side of stacked integrated circuit module 520 between columns 1204, 1206 and 1208. Spacer bars 1228, 1230 are placed against each of the z-axis substrates 702. Z-axis substrate holding wedges 1232, 1234 are then slid in between the side columns 1212-1218 in each of the spacer bars 1228, 1230. Each of the z-axis substrate holding wedges 1232, 1234 are slowly slid in between the spacer bars and side columns. As will be appreciated, the complimentary angles 1224, 1236 and 1222 and 1238 cause z-axis substrate holding wedges 1234, 1232 to be pushed away from side columns 1212-1218 as holding wedges 1234, 1232 are slid in the direction from column 1204 toward and then past column 1206, and in the direction from column 1206 toward and then past column 1208, respectively. This force causes a force to slowly exert pressure on spacer bars 1228, 1230 in the direction of z-axis substrates 702 until the proper pressure to allow solder reflow is placed upon the z-axis substrate 702 in alignment with stacked integrated circuit module 520. Thereafter, the stacked integrated circuit module 520 is reflowed by the application of heat to z-axis assembly reflow solder tool 1200 to allow the aligned z-axis substrate 702 to be solder bonded to the edges of stacked integrated circuit module 520, in accordance with the same process as described in conjunction with FIG. 9. Similarly, a solder ball alignment plate 926 and solder balls 928 can be positioned on top of stacked integrated circuit module 520 and reflowed at the same time as the z-axis substrate 702, in accordance with the process as described in conjunction with FIG. 9 hereof.

In the above detailed description of exemplary embodiments of the invention, reference is made to the accompanying drawings, which form a part hereof, and in which is shown by way of illustration, specific exemplary embodiments in which the invention may be practiced. These embodiments are described in sufficient detail to enable those skilled in the art to practice the invention, and it is to be understood that other embodiments may be utilized, and that logical, mechanical, electrical and other changes may be made without departing from the spirit or scope of the present invention. The detailed description is, therefore, not to be taken in a limiting sense, and the scope of the present invention is defined only by the appended claims. While the invention has been particularly shown and described with reference to one or more preferred embodiments, it will be understood by those skilled in the art that various changes in form and detail may be made therein without departing from the spirit and scope of the invention.

What is claimed is:

1. A method of manufacturing a semiconductor assembly, said method comprising:
    mounting a first semiconductor element on a first substrate including electrical connections;
    mounting a second semiconductor element on a second substrate including electrical connections;
    stacking said first substrate on said second substrate to form a substrate stack;
    removing a portion of said substrate stack to expose electrical connections along a side of said first substrate and a side of said second substrate; and
    mounting an interconnect substrate on said sides of said first and second substrates to selectively connect exposed electrical connections between said first and second substrates.

2. The method of claim 1, wherein said method further includes securing said first substrate on said second substrate.

3. The method of claim 2, wherein said securing further includes securing said first substrate on said second substrate by injection molding.

4. The method of claim 1, wherein said stacking further includes placing a spacer between said first substrate and said second substrate to form said substrate stack.

5. The method of claim 1, wherein said removing further includes sawing a portion of said substrate stack.

6. The method of claim 5, wherein said sawing further includes sawing said substrate stack through a center axis of a plurality of vias within each of said first and second substrates.

7. The method of claim 1, wherein said method further includes forming a ball-grid array on said substrate stack.

* * * * *